United States Patent
Landt et al.

(10) Patent No.: US 7,965,211 B1
(45) Date of Patent: Jun. 21, 2011

(54) HIGH POWER DAC POWER AMPLIFIER

(75) Inventors: Don L. Landt, Palo, IA (US); Allen W. Jones, Cedar Rapids, IA (US); Scott Zogg, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 5 days.

(21) Appl. No.: 12/614,947

(22) Filed: Nov. 9, 2009

(51) Int. Cl.
*H03M 1/66* (2006.01)
(52) U.S. Cl. ........................................ 341/144; 341/137
(58) Field of Classification Search .................. 341/144, 341/137, 138
See application file for complete search history.

(56) References Cited

U.S. PATENT DOCUMENTS

| | | | | |
|---|---|---|---|---|
| 5,859,611 A | * | 1/1999 | Lam et al. | 342/368 |
| 6,157,253 A | * | 12/2000 | Sigmon et al. | 330/10 |
| 6,384,540 B1 | * | 5/2002 | Porter et al. | 315/111.51 |
| 7,626,454 B2 | * | 12/2009 | Kim et al. | 330/124 R |

* cited by examiner

*Primary Examiner* — Peguy JeanPierre
(74) *Attorney, Agent, or Firm* — Matthew J. Evans; Daneil M. Barbieri

(57) ABSTRACT

A power amplifier architecture includes a plurality of non-linear optically driven power amplifier modules. The plurality of non-linear optically driven power amplifier modules are selectively connectable utilizing a programmable algorithm for combining at least two modules of the plurality of non-linear optically driven power amplifier modules in a time sequence yielding a piecewise approximation of a continuous waveform. The power amplifier architecture further includes at least one RF drive selectively connected to at least one of the plurality of non-linear optically driven power amplifier modules via an optical signal link generating a separate drive signal for each of the plurality of non-linear optically driven power amplifier modules.

19 Claims, 2 Drawing Sheets

HIGH POWER DAC POWER AMPLIFIER

TECHNICAL FIELD

The present disclosure relates generally to power amplifiers. Specifically, the present disclosure relates to high power amplifiers operable as converters for efficient DC to RF conversion.

BACKGROUND

New communication and navigation systems are demanding radio frequency (RF), micro- and millimeter-wave power amplifiers which are similar in operation to high performance digital-to-analog converters (DACs). These power amplifiers (PAs) must be capable of producing high power over wide frequency ranges with high direct current (DC)-to-RF efficiency, linear amplitude control over several decades and with minimum size/weight. Many of these systems must also generate linear waveforms with tight spectral control and also supply complete digital control of all the PA and DAC functions for software controlled applications.

Currently employed linearization techniques such as pre-distortion, feed-forward, and envelope restoration are limited in bandwidth, temperature range, and efficiency.

Achieving high powers have required DAC designers to use high speed devices such as, bipolar transistors, HEMTs, IGBTs or MOSFETs with large active areas (in terms of total gate width or emitter area) to obtain the specified power levels. As the device size increases however, a limit is reached in how large a device can be electrically, and how low its terminal impedances can be in terms of the ability of matching circuits to reach the extremely low impedances on the input and output of the device. Matching to large devices requires large transformation ratios which are inherently frequency band limited. This may be compounded in multi-stage power amplifiers where bandwidth limitations become even more severe as more gain stages are cascaded.

Nonlinear operation of the power amplifier is required to yield the highest efficiency, with switched mode operation being a commonly employed technique. This mode of operation can be employed with square wave drive excitation, fast rise and fall times, and push-pull differential phasing, with minimal dead time between the positive and negative rail drive excitation.

The primary function of a DAC is to convert a low power digital signal to an equivalent analog signal in a fast, efficient and precise manner. Different architectures have been used in the past to create high-speed, low-distortion DACs. DAC circuit topologies currently in use in the industry include pulse width modulator, oversampling (Delta-Sigma), R-2R, binary-weighted resistor and current-scaled DACs. In a pulse width modulator DAC a stable current or voltage is switched into a low-pass analog filter. The oversampling technique allows for the use of a lower resolution, typically 1-bit, DAC internally. R-2R DAC's have variable source impedance depending upon which resistor ladders are switched into the circuit. Weighted resistor DAC's have binary weighted resistors which directly scale the analog output voltage. In both topologies, the output voltage is less than the input voltage.

Many high speed DACs make use of some form of non-saturating current-mode switching. A straight binary DAC with one current switch per bit produces code-dependent glitches and is certainly not the most optimum architecture. A DAC with one current source per code level can be shown not to have code-dependent glitches, but it is not practical to implement for high resolutions. Current-Scaled DAC's simply scale binary weighted constant current sources or sinks based on the digital input. All of the above examples are implemented at a low power level where the main concern is the conversion of the signal. If a high-power analog signal is needed, another amplifier stage must be cascaded to provide the needed voltage or current drive.

Also almost all of the above examples have either pull up or pull down semiconductor devices (but not both), so either the rise or fall time for a voltage transition can be very slow.

Thus, a power amplifier architecture yielding linear or pseudo linear operation while maintaining system efficiency is desirable.

SUMMARY

Accordingly, the various embodiments of the present disclosure are directed to a power amplifier architecture including a plurality of non-linear optically driven power amplifier modules, the plurality of non-linear optically driven power amplifier modules selectively connectable utilizing a programmable algorithm for combining at least two modules of the plurality of non-linear optically driven power amplifier modules in a time sequence yielding a piecewise approximation of a continuous waveform. The power amplifier architecture further includes at least one RF drive selectively connected to at least one of the plurality of non-linear optically driven power amplifier modules via an optical signal link generating a separate drive signal for each of the plurality of non-linear optically driven power amplifier modules.

According to an additional embodiment of the present disclosure a power amplifier architecture includes a first power amplifier assembly further including a first plurality of non-linear optically driven power amplifier modules, the first plurality of non-linear optically driven power amplifier modules selectively connectable utilizing a programmable algorithm for combining at least two modules of the first plurality of non-linear optically driven power amplifier modules, each of the first plurality of non-linear optically driven power amplifier modules connected to a voltage source. The power amplifier architecture also includes a first RF drive selectively connectable to at least one of the first plurality of non-linear optically driven power amplifier modules via an optical signal link, the at second RF drive generating a separate drive signal for each of the first plurality of non-linear optically driven power amplifier modules. The power amplifier architecture a second amplifier assembly further including a second plurality of non-linear optically driven power amplifier modules, the second plurality of non-linear optically driven power amplifier modules selectively connectable utilizing a programmable algorithm for combining at least two modules of the second plurality of non-linear optically driven power amplifier modules, each of the second plurality of non-linear optically driven power amplifier modules connected to a voltage source. The power amplifier architecture further includes a second RF drive selectively connectable to at least one of the second plurality of non-linear optically driven power amplifier modules via an optical signal link, the second RF drive generating a separate drive signal for each of the plurality of non-linear optically driven power amplifier modules; and at least one load resistor connected to each of the first power amplifier assembly and the second power amplifier assembly.

It is to be understood that both the foregoing general description and the following detailed description are exemplary and explanatory only and are not restrictive of the invention claimed. The accompanying drawings, which are incorporated in and constitute a part of the specification, illustrate an embodiment of the disclosure and together with the general description, serve to explain the principles of the disclosure.

BRIEF DESCRIPTION OF THE DRAWINGS

The numerous objects and advantages of the present disclosure may be better understood by those skilled in the art by reference to the accompanying figures in which.

DETAILED DESCRIPTION

Reference will now be made in detail to presently preferred embodiments of the disclosure, examples of which are illustrated in the accompanying drawings.

Figure 1:
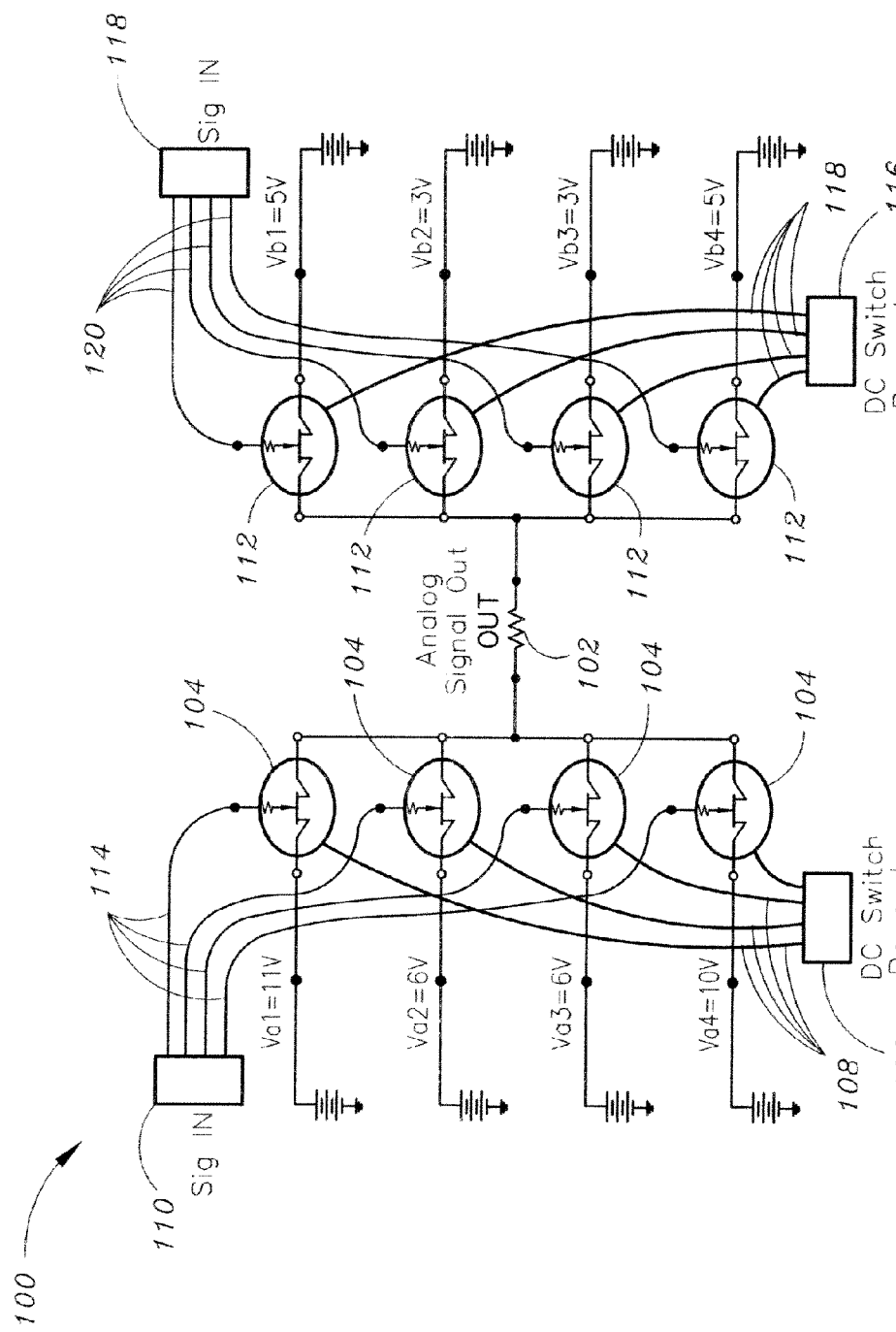
FIG. 1 is a schematic diagram of a power amplifier architecture according to an exemplary embodiment of the disclosure.
Figure 2:
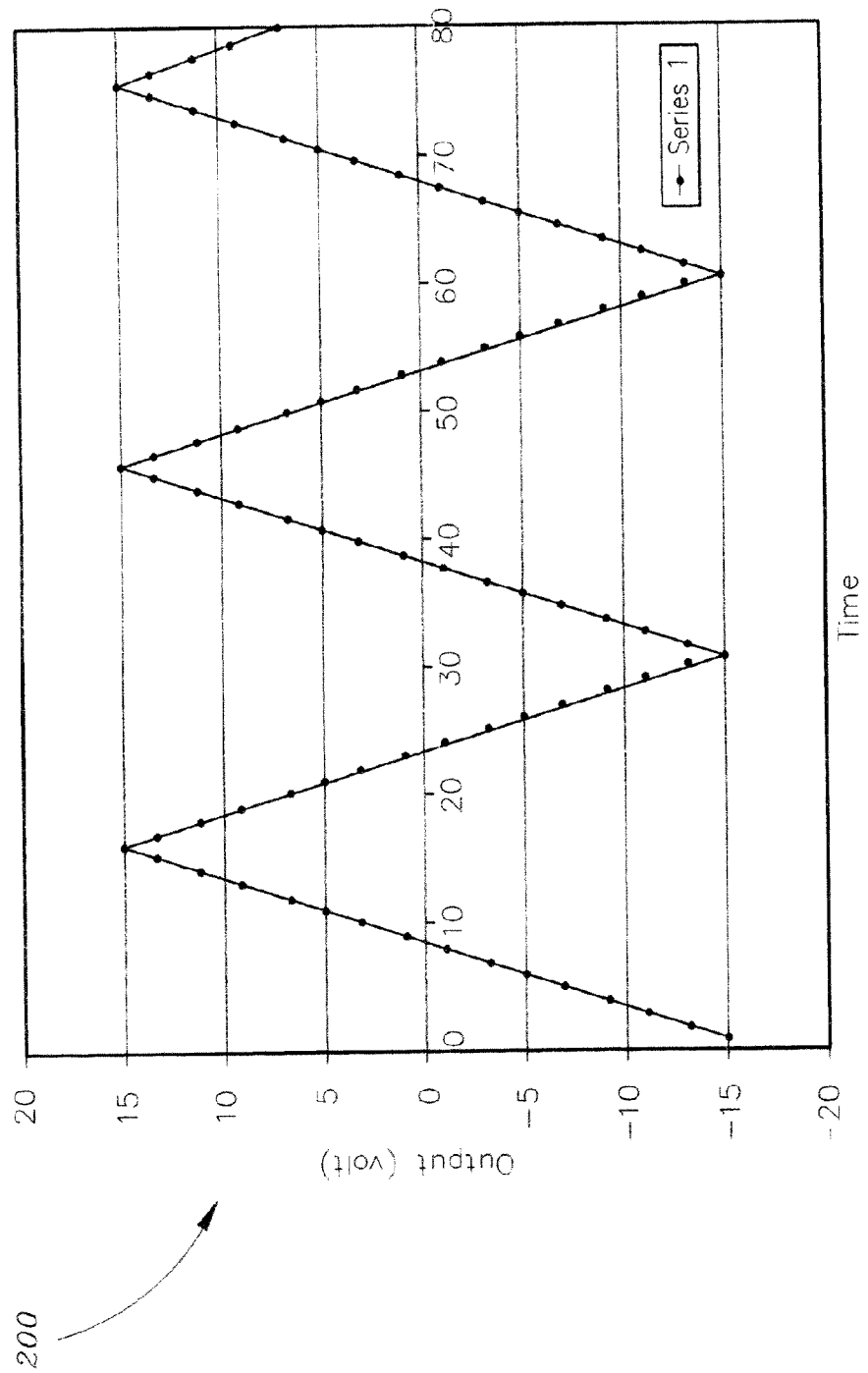
FIG. 2 is a graphical representation of a triangular output waveform showing the voltage swing capability of the present disclosure.

Referring to FIGS. 1 and 2, diagrams of a digital to analog converter 100 is described in accordance with exemplary embodiments of the present disclosure are shown. FIG. 1 is a schematic diagram of a circuit according to an exemplary embodiment of the disclosure. FIG. 2 is a graphical representation of a triangular output waveform 200 showing the voltage swing capability of the present disclosure. Digital to analog converter (DAC) may be a power amplifier assembly operating as a digital-to-analog converter, DAC, yielding linear or pseudo-linear operation, while maintaining system efficiency. A digital-to-analog converter 100 includes a plurality of non-linear optically driven power amplifier modules 104, 112. The plurality of non-linear optically driven power amplifier modules 104, 112 may be selectively connectable utilizing a programmable algorithm for combining at least two modules of the plurality of non-linear optically driven power amplifier modules in a time sequence yielding a piecewise approximation of a continuous waveform. The digital to analog converter 100 further includes at least one RF drive 110, 118 selectively connected to at least one of the plurality of non-linear optically driven power amplifier modules via an optical signal link 114, 120 generating a separate drive signal for each of the plurality of non-linear optically driven power amplifier modules 104, 112.

In the preferred embodiment, the digital-to-analog converter 100 operates with eight independent voltage sources Va1, Va2, Va3, Va4, Vb1, Vb2, Vb3, and Vb4. A load resistor 102, (e.g., a 50 ohm resistor) may be differentially connected to two of the eight supplies Va1, Va2, Va3, Va4, Vb1, Vb2, Vb3, and Vb4. Four supplies Va1, Va2, Va3, Va4, are available for a first end (e.g., the "positive end") of the load resistor 102 and four supplies Vb1, Vb2, Vb3, Vb4 are available for a second end (e.g. the "negative end") of the load resistor 102. In the example shown in FIG. 2, Va1=10V, Va2=6V, Va3=−6V, Va4=−10V, Vb1=5V, Vb2=3V, Vb3=−3V, Vb4=−5V, The resulting potential across the load resistor 102 may include sixteen different values of voltage (i.e. positive and negative values of 15, 13, 11, 9, 7, 5, 3 and 1V). One terminal of each voltage supply Va1, Va2, Va3, Va4, Vb1, Vb2, Vb3, and Vb4 may be connected to ground. Thus, faster switching may be accomplished as the potential of voltage sources to ground is the constant. Also, in the preferred embodiment, output potentials may be driven to power supply voltages through low impedances switches, providing switching speeds at very high values approaching theoretical limits.

As noted, the converter 100 may include a first plurality of power amplifier modules (e.g., switching devices) 104 and a second plurality of switching devices 112. One or more switching devices 104, 112 (e.g., high speed radio frequency (RF) switching devices) are connectable between any a supply voltage and a terminal of the load resistor 102. In the preferred embodiment, the switching devices 104, 112 may be optically sourced isolated switching devices (OSISE switching devices).

The first plurality of switching devices 104 may be Gallium Nitride (GaN) based switches. The first plurality of switching devices 104 may be optically coupled between the ports and may be optically powered. For example, the first plurality of switching devices 104 may be optically powered via a first optical link 108. In one embodiment, a first power supply 116 may be utilized to supply DC power to the first plurality switching devices 104. In a preferred embodiment, first power supply 106 is a second photonic power converter. For example, the first optical link 108 may employ a fiber optic cable and operate at an optical wavelength of approximately 808 nm. The first plurality of switching devices 104 may be configured for optical link triggering. For example, the first plurality of switching devices 104 may be triggered by a signal from a second optical link 114. In one embodiment, the first plurality of switching devices 104 may be optically triggered via a triggering signal from a first signal phase 110 supplied to the first plurality of switching devices 104 via an alternate high-speed, optical link 114. The second optical link 114 may employ a fiber optic cable and operate at an optical wavelength of about 1310 nm.

The digital to analog converter 100 may include a second plurality of switching devices 112. The second plurality of switching devices 112 may be Gallium Nitride (GaN) based switches. The second plurality of switching devices 112 may receive power via a second optical link 118. For example, the optical power link 118 may operate at an optical wavelength of 808 nm. In one embodiment, a second power supply 116 may be utilized to supply DC power to the second plurality switching devices 104. In a preferred embodiment, second power supply 116 is a photonic power converter. In one embodiment, the second plurality of switching devices 112 may be optically triggered via a triggering signal from a second signal phase 118 supplied to the second plurality of switching devices 112 via an alternate high-speed, optical link 120. The second optical link 120 may employ a fiber optic cable and operate at an optical wavelength of about 1310 nm.

The power supplies 106, 116 may include a plurality of laser diodes driven from a DC switching power supply. The power supplies 106, 116 may also include a power in port configured for converting one DC voltage level to another. The power supplies 106, 116 may be configured for supplying power to the first plurality of switching devices 104 and the second plurality of switching devices 112 via an optical links 114, 120. The power supplies 106, 116 may be configured with a plurality of independent optical links for supplying power to each of the first plurality of switching devices 104 and the second plurality of switching devices 112. The digital to analog converter 100 may be utilized for transmitting linear and nonlinear waveforms with very high simultaneous output power and efficiency. System output power, and the corresponding transmit range, may be controlled by the number of nonlinear elements activated. A 4× size and weight reduction is projected over known (e.g., legacy) power amplifier systems. By utilizing the efficiency of the nonlinear amplifier building blocks, 2× and 4× efficiency improvements are projected vs. legacy nonlinear and linear amplifiers respectively.

One or more switching devices 104, 112 may be combined in series to provide very high output powers and deliver power to the load (e.g., approximately 50 ohm load) without the use of matching structures. Also, the one or more series connected switching devices 104, 112 may provide equally shared current in the series connected devices between all the elements. Voltage across each leg of the output stage is equally shared by the element contained in the leg when the series switching devices 104, 112 are turned to the off state. The switching devices 104, 112 may include at least two inverting amplifiers providing the current necessary to change the switch state (e.g., to change the output switching device from the full "on" state to completely "off" state) in approximately a time period and on an order of magnitude shorter than the period of the RF output signal. Both P- and N-Type switching devices may be implemented with the OSISE switching device architecture.

The switching devices 104, 112 may be comprised of MMIC that may house various components including one or more switching circuits and/or optical converters. An optical converter may accept RF phasing information (discussed above) that may be relayed via optical transmission and inputted to optically coupled optical converter. Optical converters create isolation between the incoming phasing information and the switching circuit, thus ensuring isolation for a switching device. Optical converters may operate up to speeds of 100 GHz, which is helpful for microwave applications. Further it is noticed that the one or more switching devices 104, 112 may be completely isolated from an RF input except for the transfer of information between, for example, optical controllers, thus reducing any impedance between the switching devices 104, 112 and any outside circuits and increasing the switching speed.

The switching devices 104, 112 may isolate the switching elements using optical coupling a light emitting diode (LED) to a photovoltaic diode (PVD) for the RF coupling. This provides an improved switch with switching frequencies from DC to upper frequencies only limited by the speed of the optical coupling, which is currently approaching 100 GHz, yet completely decoupled from other nearby devices.

The LED may input RF phasing information which is routed through an LED driver where the signal is amplified. RF phasing information may refer to the data that will instruct the switching device 104, 112 when to turn on and turn off. Thus it controls the switching. After exiting LED driver, RF phasing information goes to an LED where the information is converted to light. Optical transmission is sent to a PVD located on MMIC on the switching device 104, 112. Optical transmission is then converted to RF by a PVD and sent onto an op-amp. Op-amp may be biased by power source. Any type of power source coupling may be implemented, such as optical coupling, magnetic couple, etc., without departing from the spirit of the invention. RF may be sent from the op-amp to a switching circuit that will either turn the switching device 104, 112 off or on. The switching device 104, 112 has isolated switching element and thus provides an isolated switching element that may handle high frequencies and large amounts of voltage and current and still switch quickly.

OSISE switching devices 104, 112 may be implemented in a basic Class D amplifier. One topology of a Class-D amplifier implements with an N-type device on the negative supply and a P-type device on the positive supply. P-type devices are generally slower and have lower operating voltages than the equivalent N-type device and, in addition the P-type device is difficult to switch on and off due to its potential around the positive voltage rail. Using OSISE switching devices 104, 112 in a Class-D amplifier provides crisp switching to both the positive and negative rail which in turn will produce better efficiencies than are possible with today's topologies. Class-D amplifiers may also be designed using a 3-way transformer coupled to the output of two N-type devices. Transformers have limited bandwidth, insertion loss and are usually large and heavy. An OSISE switching device amplifier offers a high efficiency in a compact, low weight package.

OSISE switching devices 104, 112 may be used in a class-D single ended switch, class-D balanced switch, or a switch-mode power amplifier switch all of which may be utilized in high power. For example, output power of hundreds of watts to several kilowatts is achievable using widebandwidth, high-efficiency RF and microwave amplifiers. OSISE switching devices 104, 112 may provide isolation between all switch devices, between stacked switching devices, and ground. This enables improved switch behavior of each OSISE switching device 104, 112 which is independent of other switching devices (OSISE switching device or not) and allows power amplifier devices to be efficiently stacked and operated in a series configuration or operated as switches tied to independent voltage supply lines.

Systems and apparatuses in accordance with various aspects of the present disclosure provide an improved integrated circuit. In this regard, the present disclosure may be described herein in terms of functional block components and various processing steps. It should be appreciated that such functional blocks may be realized by any number of hardware, firmware, and/or software components configured to perform the specified functions. For example, the present disclosure may employ various integrated circuit components, e.g., memory elements, digital signal processing elements, look-up tables, and the like, which may carry out a variety of functions under the control of one or more microprocessors or other control devices. Such general techniques and components that are known to those skilled in the art are not described in detail herein. Furthermore, although the disclosure is frequently described herein as pertaining to MMIC devices, it will be appreciated that the systems and methods described herein could also be applied to a D-class power amplifier.

It is to be noted that the foregoing described embodiments according to the present disclosure may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is believed that the present disclosure and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

The invention claimed is:

1. A power amplifier architecture comprising:
 a plurality of non-linear optically driven power amplifier modules, the plurality of non-linear optically driven power amplifier modules selectively connectable utilizing a programmable algorithm for combining at least two modules of the plurality of non-linear optically driven power amplifier modules; and at least one RF drive selectively connected to at least one of the plurality of non-linear optically driven power amplifier modules via an optical signal link, the at least one RF drive generating a separate drive signal for each of the plurality of non-linear optically driven power amplifier modules, wherein the plurality of non-linear optically driven power amplifier modules are combined in series to provide very high output power and deliver power to a load.

2. The power amplifier architecture of claim 1, further including:
a voltage source connected to at least one of the plurality of non-linear optically driven power amplifier modules.

3. The power amplifier architecture of claim 1, further including:
an independent voltage source connected to each of the plurality of non-linear optically driven power amplifier modules.

4. The power amplifier architecture of claim 3, wherein the independent voltage source connected to each of the plurality of non-linear optically driven power amplifier modules include:
at least eight independent voltage sources.

5. The power amplifier architecture of claim 1, further including:
a power supply supplying power to the plurality of non-linear optically driven power amplifier modules.

6. The power amplifier architecture of claim 1, wherein the power supply supplying power to the plurality of non-linear optically driven power amplifier modules includes:
a photonic power converter.

7. A power amplifier architecture comprising:
a plurality of non-linear optically driven power amplifier modules, the plurality of non-linear optically driven power amplifier modules selectively connectable utilizing a programmable algorithm for combining at least two modules of the plurality of non-linear optically driven power amplifier modules; and
at least one RF drive selectively connected to at least one of the plurality of non-linear optically driven power amplifier modules via an optical signal link, the at least one RF drive generating a separate drive signal for each of the plurality of non-linear optically driven power amplifier modules, wherein the plurality of non-linear optically driven power amplifier modules include:
at least two inverting amplifiers providing an amount of current necessary to change a switch state of each of the plurality of non-linear optically driven power amplifier modules in approximately a time period and on an order of magnitude shorter than a period of an RF output signal.

8. A power amplifier architecture comprising:
a first power amplifier assembly further including:
a first plurality of non-linear optically driven power amplifier modules, the first plurality of non-linear optically driven power amplifier modules selectively connectable utilizing a programmable algorithm for combining at least two modules of the first plurality of non-linear optically driven power amplifier modules, each of the first plurality of non-linear optically driven power amplifier modules connected to a voltage source;
a first RF drive selectively connectable to at least one of the first plurality of nonlinear optically driven power amplifier modules via an optical signal link, the at second RF drive generating a separate drive signal for each of the first plurality of non-linear optically driven power amplifier modules;
a second amplifier assembly further including:
a second plurality of non-linear optically driven power amplifier modules, the second plurality of non-linear optically driven power amplifier modules selectively connectable utilizing a programmable algorithm for combining at least two modules of the second plurality of non-linear optically driven power amplifier modules, each of the second plurality of non-linear optically driven power amplifier modules connected to a voltage source;
a second RF drive selectively connectable to at least one of the second plurality of non-linear optically driven power amplifier modules via an optical signal link, the second RF drive generating a separate drive signal for each of the plurality of non-linear optically driven power amplifier modules; and
at least one load resistor connected to each of the first power amplifier assembly and the second power amplifier assembly.

9. The power amplifier architecture of claim 8, wherein the at least one load resistor is connected to each of the first power amplifier assembly and the second power amplifier assembly via at least one voltage source connected to each of the first power amplifier assembly and the second power amplifier assembly.

10. The power amplifier architecture of claim 9, further including:
an independent voltage source connected to each of the plurality of non-linear optically driven power amplifier modules.

11. The power amplifier architecture of claim 10, wherein the independent voltage source connected to each of the plurality of non-linear optically driven power amplifier modules include:
at least eight independent voltage sources.

12. The power amplifier architecture of claim 8, further including: a first power supply supplying power to the first power amplifier assembly.

13. The power amplifier architecture of claim 12, wherein the first power supply supplying power to the first plurality of non-linear optically driven power amplifier modules includes:
a photonic power converter.

14. The power amplifier architecture of claim 13, wherein the first power supply supplying power to the first power amplifier assembly includes:
a separate optical link supplying power to each of the first plurality of non-linear optically driven power amplifier modules.

15. The power amplifier architecture of claim 8, further including:
a second power supply supplying power to the second power amplifier assembly.

16. The power amplifier architecture of claim 15, wherein the second power supply supplying power to the second plurality of non-linear optically driven power amplifier modules includes:
a photonic power converter.

17. The power amplifier architecture of claim 15, wherein the second power supply
supplying power to the second power amplifier assembly includes:

a separate optical link supplying power to each of the second plurality of non-linear optically driven power amplifier modules.

18. The power amplifier architecture of claim 8, wherein the first plurality of nonlinear optically driven power amplifier modules and the second plurality of non-linear optically driven power amplifier modules are combined in series to provide very high output power and deliver power to an approximately 50 ohm load without the use of matching structures.

19. The power amplifier architecture of claim 8, wherein each of the first plurality of non-linear optically driven power amplifier modules and the second plurality of non-linear optically driven power amplifier modules each include:

at least two inverting amplifiers providing an amount of current necessary to change a switch state of each of the plurality of non-linear optically driven power amplifier modules in approximately a time period and on an order of magnitude shorter than a period of an RF output signal.

* * * * *